US012626890B2

(12) United States Patent
Hong et al.

(10) Patent No.: US 12,626,890 B2
(45) Date of Patent: May 12, 2026

(54) SUBSTRATE TREATING APPARATUS

(71) Applicant: SEMES CO., LTD., Cheonan-si (KR)

(72) Inventors: Jin Hee Hong, Hwaseong-si (KR); Yun Sang Kim, Seongnam-si (KR); Min Sung Jeon, Osan-si (KR); Soon-Cheon Cho, Pyeongtaek-si (KR); Sung Min Choi, Osan-si (KR); Jung Hoon Park, Sejong-si (KR)

(73) Assignee: SEMES CO., LTD., Cheonan-si (KR)

( * ) Notice: Subject to any disclaimer, the term of this patent is extended or adjusted under 35 U.S.C. 154(b) by 837 days.

(21) Appl. No.: 17/725,000

(22) Filed: Apr. 20, 2022

(65) Prior Publication Data

US 2023/0343563 A1      Oct. 26, 2023

(51) Int. Cl.
H01J 37/32       (2006.01)
H10P 50/20       (2026.01)
*H10P 72/00*       (2026.01)

(52) U.S. Cl.
CPC .... H01J 37/32568 (2013.01); H01J 37/3244 (2013.01); H01J 37/32541 (2013.01); H01J 37/3255 (2013.01); H01J 37/32559 (2013.01); *H01J 37/32082* (2013.01); *H01J 2237/334* (2013.01); *H10P 72/0436* (2026.01)

(58) Field of Classification Search
CPC ............. H01J 37/32568; H01J 37/3255; H01J 37/32559; H01J 2237/334; H01J 37/3244; H01J 37/32541; H01J 37/32082–32091; H01L 21/67115
USPC .................................................... 156/345.34
See application file for complete search history.

(56) References Cited

U.S. PATENT DOCUMENTS

| | | | | | |
|---|---|---|---|---|---|
| 5,685,949 | A | * | 11/1997 | Yashima | H01J 37/32082 134/1.1 |
| 6,929,830 | B2 | * | 8/2005 | Tei | C23C 16/511 427/163.4 |
| 11,488,804 | B2 | * | 11/2022 | Shin | H01J 37/32568 |
| 2005/0276928 | A1 | * | 12/2005 | Okumura | H01L 21/3065 427/446 |
| 2008/0276958 | A1 | * | 11/2008 | Mehta | B08B 7/0035 134/1.2 |
| 2011/0226421 | A1 | * | 9/2011 | Hayashi | H01J 37/32091 156/345.43 |

(Continued)

FOREIGN PATENT DOCUMENTS

| | | |
|---|---|---|
| JP | 2002100616 | 4/2002 |
| JP | 2013041872 | 2/2013 |

(Continued)

*Primary Examiner* — Aiden Lee

(57) ABSTRACT

The inventive concept provides a substrate treating apparatus. The substrate treating apparatus includes a chamber having a treating space therein; a support unit disposed within the treating space and configured to support a substrate; and a plasma generation unit configured to generate a plasma from a process gas supplied to the treating space; and wherein the plasma generation unit comprises: a bottom electrode member; and a top electrode member opposite to the bottom electrode member, wherein the top electrode member comprises: an electrode plate including an electrode; a first plate made of a different material from the electrode plate; and a second plate, and wherein the second plate, the electrode plate, and the first plate are stacked on one another.

16 Claims, 3 Drawing Sheets

420

(56)     References Cited

U.S. PATENT DOCUMENTS

| | | | | |
|---|---|---|---|---|
| 2015/0380216 A1 * | 12/2015 | Jang | .................. | H01J 37/32192 |
| | | | | 156/345.41 |
| 2018/0340257 A1 * | 11/2018 | Achary | .................. | C23C 16/50 |
| 2020/0111643 A1 * | 4/2020 | Tran | .................. | H01J 37/32357 |
| 2021/0183620 A1 * | 6/2021 | Tian | .................. | H01L 21/67069 |
| 2022/0199379 A1 * | 6/2022 | Lee | .................. | H01J 37/32724 |

FOREIGN PATENT DOCUMENTS

| | | |
|---|---|---|
| JP | 2015159233 | 9/2015 |
| JP | 2022134112 | 9/2022 |
| JP | 2023001073 | 1/2023 |
| JP | 2023003410 | 1/2023 |
| KR | 1020040102300 | 12/2004 |
| KR | 1020080098386 | 11/2008 |
| KR | 10-2008-0104236 | 12/2008 |
| KR | 1020130016313 | 2/2013 |
| KR | 1020140030450 | 3/2014 |
| KR | 10-2014-0104891 | 8/2014 |
| KR | 1020170026873 | 3/2017 |
| KR | 10-2019-0120741 | 10/2019 |
| KR | 102189323 | 12/2020 |

* cited by examiner

400: 420, 440, 460

SUBSTRATE TREATING APPARATUS

BACKGROUND

Embodiments of the inventive concept described herein relate to a substrate treating apparatus and substrate treating method using a plasma.

In order to manufacture a semiconductor device, a desired pattern is formed on the substrate by performing various processes such as a photolithography process, an etching process, an ashing process, an ion implantation process, a thin film deposition process, and a cleaning process. Among them, the etching process is a process of removing a selected heating region from a film formed on a substrate, and a wet etching and a dry etching are used.

An etching device using a plasma is used for the dry etching. In general, in order to generate the plasma, an electromagnetic field is formed in an inner space of the chamber, and the electromagnetic field excites a process gas provided in the chamber into a plasma state.

The plasma refers to an ionized gas state made of ions, electrons, radicals, or the like. The plasma is generated by a very high temperature, a strong electric field or a high frequency electromagnetic field. In a semiconductor device manufacturing process, the etching process is performed using the plasma.

In a substrate treating apparatus using the plasma as aforementioned, as a method of raising a temperature of the substrate, the temperature of the substrate is raised by using a heating means (heating wire) of a substrate support member on which the substrate is placed. In the case of a conventional method of heating the substrate using a heater, it takes a long time to increase and decrease a temperature, and it is difficult to uniformly heat an entirety of the substrate.

To solve this problem, a method of annealing the substrate using microwaves at an upper zone of a chamber is proposed. When such a method is used, a time required for heating is reduced, but a non-uniform heat transfer occurs in the substrate, such that a significant difference in a temperature between an edge part and a center part of the substrate occurs during the process, which causes productivity reduction in a semiconductor chip.

Therefore, there is a need to redesign the structural characteristics of a top window and an electrode in the chamber in order to generate a uniform heat distribution by microwaves on an entire surface of the substrate.

SUMMARY

Embodiments of the inventive concept provide a top window and an electrode structure for improving a uniformity of a heating and a plasma.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber having a treating space therein; a support unit disposed within the treating space and configured to support a substrate; and a plasma generation unit configured to generate a plasma from a process gas supplied to the treating space; and wherein the plasma generation unit comprises: a bottom electrode member; and a top electrode member opposite to the bottom electrode member, wherein the top electrode member comprises: an electrode plate including an electrode; a first plate made of a different material from the electrode plate; and a second plate, and wherein the second plate, the electrode plate, and the first plate are stacked on one another.

In an embodiment, a thickness of a center part and a thickness of an edge part in the top electrode member are substantially equal.

In an embodiment, the electrode plate, the first plate, and the second plate are provided as a transparent material.

In an embodiment, the first plate is provided as a quartz material and the second plate is provided as an etch-resistant material.

In an embodiment, the electrode plate is a transparent electrode maintaining a transparency, and the transparent electrode is made of at least one of an ITO, an AZO, an FTO, an ATO, an $SnO_2$, a ZnO, an $IrO_2$, an $RuO_2$, a graphene, a metal nanowire, a CNT, any mixture thereof or any stack combinations thereof.

In an embodiment, a thickness of a center part and an edge part of the first plate, a thickness of a center part and an edge area of the second plate, a thickness of a center part and an edge area of the electrode plate are provided to be the same.

In an embodiment, the electrode plate is disposed on a top of the second plate.

The inventive concept provides a substrate treating apparatus. The substrate treating apparatus includes a chamber having a treating space therein; a support unit disposed within the treating space and configured to support a substrate; and a plasma generation unit configured to generate a plasma from a process gas supplied to the treating space; and wherein the plasma generation unit comprises: a bottom electrode member; and a top electrode member opposite to the bottom electrode member, and wherein the top electrode member comprises: an electrode plate including an electrode; a first plate made of a different material from the electrode plate; and a second plate, and wherein the second plate, the electrode plate, and the first plate are stacked on one another, and a thickness of a center part of the top electrode member and a thickness of an edge part of the top electrode member are different.

In an embodiment, a thickness of a center part of the electrode plate and a thickness of an edge part of the electrode plate are different.

In an embodiment, a thickness of a center part of the first plate and a thickness of an edge part of the first plate are different.

In an embodiment, a thickness of a center part of the electrode plate and a thickness of an edge area of the electrode plate are different, and a thickness of a center part of the first plate and a thickness of an edge area of the first plate are different.

In an embodiment, a thickness of a center part of the second plate and a thickness of an edge area of the second plate are different.

In an embodiment, the electrode plate, the first plate, and the second plate are provided as a transparent material.

In an embodiment, the first plate is provided as a quartz material and the second plate is provided as an etch-resistant material.

In an embodiment, the electrode plate is a transparent electrode maintaining a transparency, and the transparent electrode is made of at least one of an ITO, an AZO, an FTO, an ATO, an $SnO_2$, a ZnO, an $IrO_2$, an $RuO_2$, a graphene, a metal nanowire, a CNT, any mixture thereof or any stack combinations thereof.

The inventive concept provides a substrate treating apparatus. The substrate treating apparatus includes a chamber having a treating space therein; a support unit disposed within the treating space and configured to support a substrate; and a plasma generation unit configured to generate a plasma from a process gas supplied to the treating space; and wherein the plasma generation unit comprises: a bottom electrode member; and a top electrode member opposite to the bottom electrode member, and wherein the top electrode member comprises: an electrode plate including an electrode; a first plate made of a different material from the electrode plate; and a second plate, and wherein the second plate, the electrode plate, and the first plate are stacked on one another, and a first thickness of a center part of the top electrode member and a second thickness of an edge part of the top electrode member are different, and a difference between the first thickness and the second thickness is 500% or less of the second thickness or 500% or less of the first thickness.

In an embodiment, a thickness of a center part of the electrode plate and a thickness of an edge part of the electrode plate are different.

In an embodiment, a thickness of a center part of the first plate and a thickness of an edge part of the first plate are different.

In an embodiment, a thickness of a center part of the electrode plate and a thickness of an edge area of the electrode plate are different and a thickness of a center part of the first plate and a thickness of an edge area of the first plate are different.

In an embodiment, a thickness of a center part of the second plate and a thickness of an edge area of the second plate are different.

In an embodiment, the electrode plate, the first plate, and the second plate are provided as a transparent material.

In an embodiment, the first plate is provided as a quartz material, and the second plate is provided as an etch-resistant material.

In an embodiment, the electrode plate is a transparent electrode maintaining a transparency, and the transparent electrode is made of at least one of an ITO, an AZO, an FTO, an ATO, an $SnO_2$, a ZnO, an $IrO_2$, an $RuO_2$, a graphene, a metal nanowire, a CNT, any mixture thereof or any stack combinations thereof.

According to an embodiment of the inventive concept, a uniformity of a heating and a plasma can be improved at an entire surface of a substrate.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
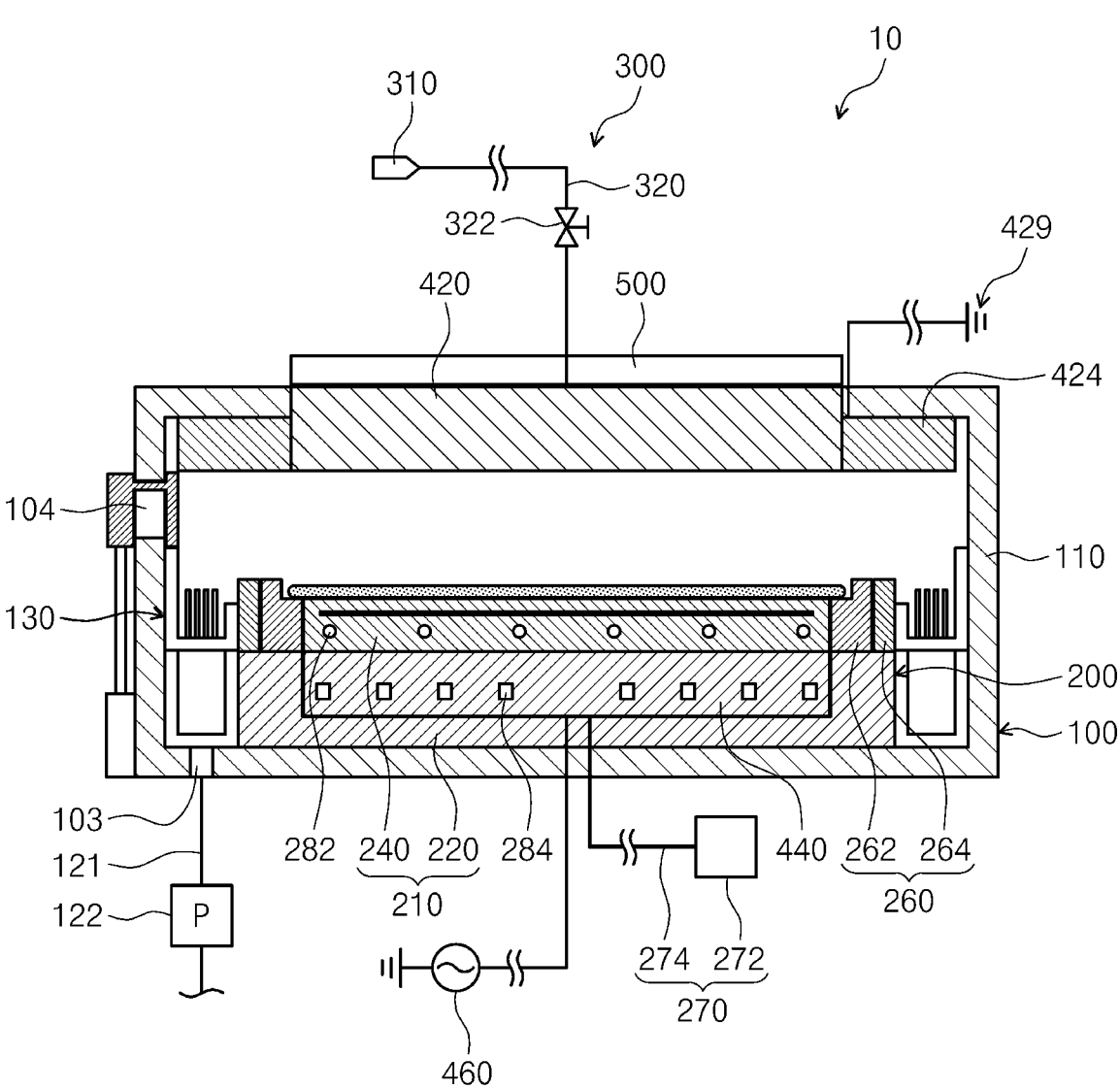
FIG. 1 illustrates a substrate treating apparatus according to an embodiment of the inventive concept.

Other advantages and features of the inventive concept, and a method for achieving the same, will become apparent with reference to the embodiments described below in detail together with the accompanying figures. However, the inventive concept is not limited to the embodiments disclosed below, but may be implemented in various different forms, and this embodiment is provided only to ensure that the disclosure is complete and to fully inform the scope of this invention to those skilled in the art.

Even if not defined, all terms (including technical or scientific terms) used herein have the same meaning as those generally accepted by conventional technology in the prior art to which this invention belongs. Terms defined by general dictionaries may be construed to have the same meaning as those of the relevant technology and/or the text of this application, and will not be conceptualized or excessively formalized, if not clearly defined herein.

Terms such as first, second, and the like may be used to describe various components, but the components should not be limited by the terms. The terms are used only for the purpose of distinguishing one component from another. For example, a first component may be referred to as a second component without departing from the scope of the inventive concept, and similarly, the second component may also be referred to as the first component.

The singular expression includes plural expressions unless the context clearly implies otherwise. In addition, shapes and sizes of elements in the figures may be exaggerated for clearer explanation.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" "include" "including" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

In an embodiment of the inventive concept, a substrate treating apparatus for etching a substrate using a plasma will be described. However, the technical features of the inventive concept are not limited thereto, and may be applied to various kinds of apparatus for treating the substrate W using the plasma and/or various kinds of apparatus in which the substrate placed on a support unit is plasma-treated.

In addition, in an embodiment of the inventive concept, an electrostatic chuck as a support unit will be described as an example. However, the inventive concept is not limited thereto, and the support unit may support the substrate by a mechanical clamping or by a vacuum.

FIG. 1 illustrates a substrate treating apparatus according to an embodiment of the inventive concept.

Referring to FIG. 1, the substrate treating apparatus 10 may include a process chamber 100, a support unit 200, a gas supply unit 300, a plasma generation unit 400, and a heating unit 500. The substrate treating apparatus 10 treats the substrate W using a plasma.

The process chamber 100 has a space for performing a process therein. An exhaust hole 103 is formed on a bottom side of the process chamber 100. The exhaust hole 103 is connected to an exhaust line 121 on which a pump 122 is mounted. The reaction by-products generated during the process and a gas remaining in the process chamber 100 are exhausted through the exhaust hole 103 and the exhaust line 121 to the outside of the process chamber 100. In addition, an inner space of the process chamber 100 is decompressed to a predetermined pressure by such exhaust process. In an embodiment, the exhaust hole 103 may be provided at a position as to directly communicating with a through hole 158 of a liner unit 130 which will be described later.

An opening 104 is formed on a sidewall of the process chamber 100. The opening 104 functions as a passage through which the substrate enters and exits the process chamber 100. The opening 104 is opened and closed by a door assembly (not shown). According to an embodiment, the door assembly (not shown) has an outer door, an inner door, and a connection plate. The outer door is provided on an outer wall of the process chamber. The inner door is provided on an inner wall of the process chamber. The outer door and the inner door are fixedly coupled to each other by the connection plate. The connection plate is provided to extend from an inside to an outside of the process chamber through the opening. A door driver moves the outer door in an up/down vertical direction. The door driver may include a pneumatic cylinder or a motor.

The support unit 200 is positioned in a bottom region of an inside of the process chamber 100. The support unit 200 supports the substrate W by an electrostatic force. Unlike this, the support unit 200 may support the substrate W in various ways such as a mechanical clamping.

The support unit 200 may include a support plate 210, a ring assembly 260, and a gas supply line unit 270. The substrate W is placed on the support plate 210. The support plate 210 has a base 220 and an electrostatic chuck 240. The electrostatic chuck 240 supports the substrate W on its top surface by an electrostatic force. The electrostatic chuck 240 is fixedly coupled onto the base 220.

The ring assembly 260 has a ring shape. The ring assembly 260 is provided to surround a circumference of the support plate 210. In an embodiment, the ring assembly 260 is provided to surround a circumference of the electrostatic chuck 240. The ring assembly 260 supports an edge region of the substrate W. According to an embodiment, the ring assembly 260 has a focus ring 262 and an insulating ring 264. The focus ring 262 is provided to surround the electrostatic chuck 240 and focuses the plasma to the substrate W. The insulating ring 264 is provided to surround the focus ring 262. Optionally, the ring assembly 260 may include an edge ring (not shown) provided in close contact with a circumference of the focus ring 262 to prevent a side surface of the electrostatic chuck 240 from being damaged by the plasma. Unlike the above description, a structure of the ring assembly 260 may be variously modified.

The gas supply line unit 270 includes a gas supply source 272 and a gas supply line 274. The gas supply line 274 is provided to supply a gas to a space between the ring assembly 260 and the electrostatic chuck 240. The gas supply line 274 supplies a gas to remove foreign substances remaining on a top surface of the ring assembly 260 or in an edge region of the electrostatic chuck 240. In an embodiment, the gas may be nitrogen gas $N_2$. Optionally, other gases or cleaners may be supplied. The gas supply line 274 may be formed to be connected between the focus ring 262 and the electrostatic chuck 240 inside the support plate 210. Alternatively, the gas supply line 274 may be provided inside the focus ring 262 and bent to be connected between the focus ring 262 and the electrostatic chuck 240.

According to an embodiment, the electrostatic chuck 240 may be provided as a ceramic material, the focus ring 262 may be provided as a silicon material, and the insulating ring 264 may be provided as a quartz material. A heating member 282 and a cooling member 284 for maintaining the substrate W at a process temperature during the process may be provided in the electrostatic chuck 240 or the base 220. The heating member 282 may be provided as a heating wire. The cooling member 284 may be provided as a cooling line through which a refrigerant flows. According to an embodiment, the heating member 282 may be provided in the electrostatic chuck 240, and the cooling member 284 may be provided in the bottom electrode 440.

The gas supply unit 300 supplies a process gas into the process chamber 100. The gas supply unit 300 includes a gas storage unit 310, a gas supply line 320, and a gas inlet port 330. The gas supply line 320 connects the gas storage unit 310 and the gas inlet port 330. The gas supply line 320 supplies the process gas stored in the gas storage unit 310 to the gas inlet port 330. A valve 322 for opening and closing a passage or adjusting a flow rate of a fluid flowing through the passage may be installed at the gas supply line 320.

The plasma generation unit 400 generates the plasma from the process gas remaining in a discharge space. The discharge space corresponds to space above the support unit 200 in the process chamber 100. The plasma generation unit 400 may have a capacitive coupled plasma source.

The plasma generation unit may include a top electrode member 420, a bottom electrode member 440, and a high frequency power supply 460. The base 220 is provided in a metallic material. The base 220 may be provided as a bottom electrode member 440 in an embodiment of the inventive concept. The top electrode member 420 and the bottom electrode member 440 may be provided to face each other in the up/down direction.

The top electrode member 420 according to the inventive concept will be described later with reference to FIG. 2 to FIG. 6. The plasma generation unit according to the inventive concept may generate the plasma by applying an RF voltage to the top electrode member 420 or the bottom electrode member 440 or both of the top electrode member 420 and bottom electrode member 440 to generate an electric field between the top electrode member 420 and the bottom electrode member 440.

The top electrode member 420 according to the inventive concept may have a structure including a first plate, an electrode plate, and a second plate so that a microwave by the heating unit 500 can be delivered to the substrate without loss.

A detailed structure of the top electrode member 420 according to the inventive concept will be described later with reference to FIG. 2 to FIG. 6.

The plasma generation unit 400 according to the inventive concept may include a shower head and a ring assembly, which may be formed in a second plate structure of the top electrode member to be described later. The shower head may be positioned above the electrostatic chuck 240 and may be provided with a diameter greater than that of the electrostatic chuck 240. Holes for injecting the gas may be formed at the shower head. The ring assembly is provided to surround the shower head. The ring assembly may be provided in close contact with the shower head.

According to an embodiment, the top electrode member 420 may be grounded 429, and a high frequency power supply 460 may be connected to the bottom electrode member 440. In some embodiments, the high frequency power supply 460 may be connected to the top electrode member 420 and the bottom electrode member 440 may be grounded. In some embodiments, a high frequency power supply 460 may be connected to both the top electrode member 420 and the bottom electrode member 440. According to an embodiment, the high frequency power supply 460 may continuously apply a power or a pulse power to the top electrode member 420 and/or the bottom electrode member.

The heating unit 500 may apply the microwave for an annealing treatment of a substrate on the support unit 200. Since a wavelength of the microwave is much longer than a thickness and a spacing of a metal wiring layer of a semiconductor chip, a depth at which the microwave penetrates into a metal material is less than several μm. According to an embodiment, there is an effect of rapidly raising a surface temperature to a target temperature by heating a surface of a substrate or a die by a microwave heat treatment.

The heating unit 500 may include a waveguide that directs the microwave into the chamber 100. The heating unit 500 may apply the microwave having a frequency of 1 to 5 GHz. According to an embodiment of the inventive concept, since the surface of the substrate is selectively heated by the microwave, a temperature increase rate and a cooling rate are fast, and the surface of the substrate may be heated to the target temperature within a short time, thereby shortening a process time.

According to an embodiment, the heating unit 500 according to the inventive concept may be provided as a heat treating unit using the microwave. Alternatively, the heating unit 500 according to the inventive concept may be provided as a heat treating unit using a laser.

In the inventive concept, a heat source such as the microwave and the laser may pass through the top electrode member 420 to heat the substrate. The top electrode member 420 may be provided as a transparent material through which a light may be transmitted.

Figure 2:
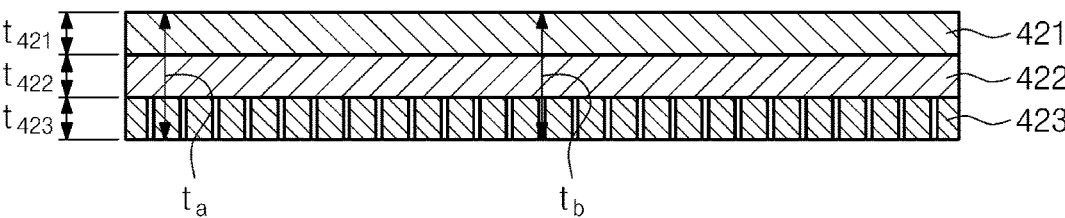
FIG. 2 illustrates a top electrode member according to an embodiment of the inventive concept.

FIG. 2 illustrates the top electrode member 420 according to an embodiment of the inventive concept.

In the inventive concept, the top electrode member 420 including a transparent electrode is proposed to improve a heat uniformity and a plasma uniformity of the substrate. The top electrode member 420 according to the inventive concept may include an electrode plate 422 including an electrode, a first plate 421 made of a material different from that of the electrode plate 422, and a second plate 423. According to an embodiment, the top electrode member 420 may be provided by stacking the second plate 423, the electrode plate 422, and the first plate 421.

Referring to FIG. 2 to FIG. 6, an embodiment in which the top electrode member 420 is stacked and provided in an order of the second plate 423, the electrode plate 422, and the first plate 421 is illustrated. However, a stacking order is not limited thereto, and the second plate 423, the first plate 421, and the electrode plate 422 may be stacked in this order or any other order.

Hereinafter, as an example, the top electrode member 420 stacked in the order of the second plate 423, the electrode plate 422, and the first plate 421 will be described.

The top electrode member 420 according to the inventive concept may include the electrode plate 422 serving as a top electrode. A ground or a high frequency power may be connected to the electrode plate 422. The electrode plate 422 may include or may be a transparent electrode. The second plate 423 may be provided as an etch-resistant material to prevent an etching of a material during a plasma treating process. According to an embodiment, the second plate 423 may be provided as a structure including a showerhead. However, this is only an example, and the second plate 423 may be provided as an etch-resistant material that does not include the showerhead. The first plate 421 may serve as a dielectric window. The first plate 421 may be a nanowire having a transparency. According to an embodiment, the electrode plate 422, the first plate 421, and the second plate 423 included in the top electrode member 420 may be provided as a transparent material so that an energy provided from the heating unit 500 may pass therethrough.

According to an embodiment, the electrode plate 422 can be a transparent electrode formed of an indium tin oxide ITO. According to an embodiment, the electrode plate 422 may be any one of an ITO (Indium Tin Oxide), an MnO (Manganese Oxide), a CNT (Carbon Nano Tube), a ZnO (Zinc Oxide), an IZO (Indium Zinc Oxide), an ATO (Antimony Tin Oxide), an SnO2, an IrO2, an RuO2, a dielectric/metal/dielectric multilayer (SnO2/Ag/SnO2), a graphene, a carbon nano tube (CNT), any mixture thereof or any stack combinations thereof. That is, the electrode plate 422 may be provided as a transparent conductive material, thereby increasing a transmittance of the microwave.

According to an embodiment, the first plate 421 may be provided as a quartz material. According to an embodiment, the first plate 421 may be an SiO2. According to an embodiment, the second plate 423 may be provided as an etch-resistant material. According to an embodiment, the second plate 423 may be any one of a $Y_2O_3$, a YSZ (Yttria-stabilized zirconia, $ZrO_2/Y_2O_3$), a YAG (yttrium aluminum garnet, $Y_3Al_5O_{12}$), an $Al_2O_3$, a $Cr_2O_3$, a Nb2O5, a $Si_3N_3$, any mixture thereof or any stack combinations thereof. The second plate 423 may be provided as a material having a transparency, and a plasma resistance and an etch resistance. Accordingly, it may have an excellent conductivity and perform a protection of the electrode plate 422.

According to an embodiment of FIG. 2, a thickness of a center part and an edge part of the top electrode member 420 may be substantially equal. In FIG. 2, the thickness of the center part is indicated by $t_b$ and the thickness of the edge part is to be indicated by $t_a$. Referring to FIG. 2, the thickness of the center part and the thickness of the edge part may be the same. According to an embodiment, a thickness $t_{421}$ of the first plate 421(a thickness of the edge part of the first plate 421), a thickness $t_{422}$ of the second plate 423(a thickness of the edge part of the second plate 423), and a thickness $t_{423}$ of the electrode plate 422(a thickness of the edge part of the electrode plate 422) may be the same. According to an embodiment, the center part and the edge part of the first plate 421, the center part and the edge part of the second plate 423, and the center part and the edge part of the electrode plate 422 may have the same thickness.

As shown in FIG. 2, using the top electrode member 420 having vertically stacked triple layer, a heat applied by the heating unit 500 may be easily delivered into the process chamber 110, and the top electrode member 420 may be protected from an external environment as compared with the electrode member provided only as a single layer.

According to an embodiment, the electrode plate 422 may be disposed on a top of the second plate 423 and thus be protected from a plasma etching.

FIG. 3 to FIG. 6 illustrate the top electrode member 420 according to another embodiment of the inventive concept.

According to an embodiment of FIG. 3 to FIG. 6, materials of the first plate 421, the second plate 423, and the electrode plate 422 are the same as those described with reference to FIG. 2 and thus any repeated descriptions thereof will be omitted. In the embodiments of FIG. 3 to FIG. 6, the top electrode member 420 may have a thickness profile different from those shown in FIG. 2.

Referring to FIG. 3 to FIG. 6, a thickness $t_b$ of the center part and a thickness $t_a$ of the edge part of the top electrode member 420 are provided differently. Such difference in thickness between the edge part and center part of the top electrode member 420 may be caused by the electrode plate 422, the first plate 421, and/or the second plate 423.

Figure 3:
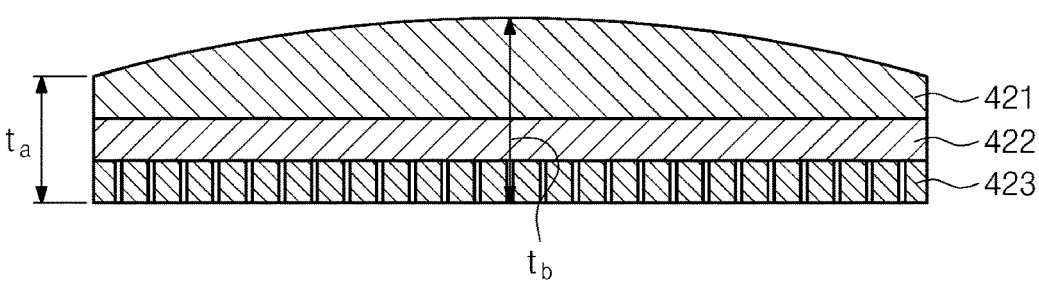
FIG. 3 to FIG. 6 illustrate the top electrode member according to another embodiment of the inventive concept.

According to an embodiment of FIG. 3, the first plate 421 may have uneven thickness, e.g., a thickness of the center part and the edge part of the first plate 421 may be provided differently. The electrode plate 422 and the second plate 423 may have an even thickness and further may have flat top and bottom surfaces. The first plate 421 may have flat bottom surface and curved(convex) top surface. Accordingly, in the top electrode member 420, the thickness of the center $t_b$ may be different from the thickness of the edge $t_a$, e.g., the thickness of the center $t_b$ is greater than the thickness of the edge $t_a$.

Figure 4:
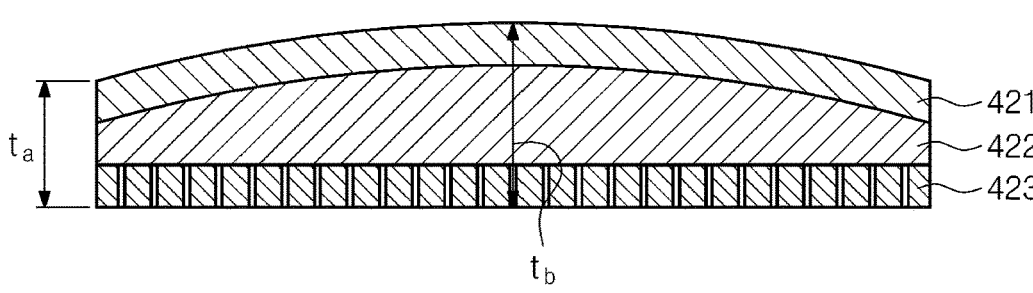

According to an embodiment of FIG. 4, the electrode plate 422 may have an uneven thickness, e.g., a thickness of the center part and the edge part of the electrode plate 422 may be provided differently. The first plate 421 and the second plate 423 may have an even thickness while the first plate 421 may have curved top and bottom surfaces but the second plate 423 may have flat top and bottom surfaces. The electrode plate 422 may have curved (convex) top surface and flat bottom surface. Accordingly, in the top electrode member 420, the thickness of the center $t_b$ may be different from the thickness of the edge $t_a$, e.g., the thickness of the center $t_b$ is greater than the thickness of the edge $t_a$.

Figure 5:
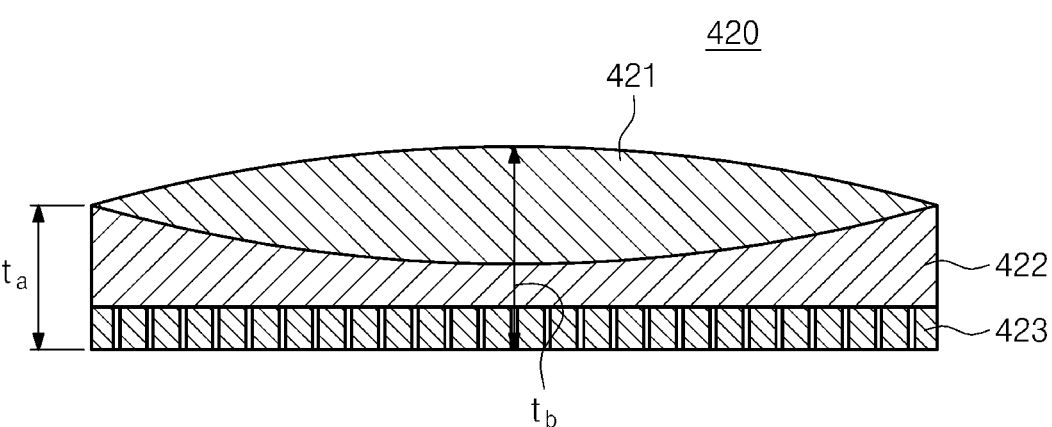

According to an embodiment of FIG. 5, the first plate 421 and the electrode plate 422 may have an uneven thickness. A thickness of the center part and the edge part of the electrode plate 422 may be differently, and a thickness of the center part and the edge part of the first plate 421 may be provided differently. The first plate 421 may have curved top and bottom surfaces, e.g., convex top and bottom surface (convex lens shape) thereby the thickness decreases gradually from the center to the edge. The electrode plate 422 may have a concave top surface mating with convex bottom surface of the first plate 421. The second plate 423 may have an even thickness with flat top and bottom surfaces. Accordingly, in the top electrode member 420, the thickness of the center $t_b$ may be different from the thickness of the edge $t_a$, e.g., the thickness of the center $t_b$ is greater than the thickness of the edge $t_a$.

Figure 6:
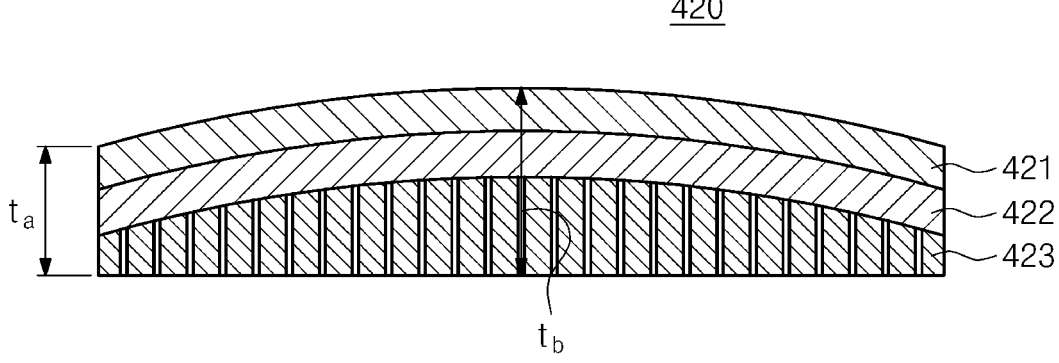

According to an embodiment of FIG. 6, the second plate 423 may have an uneven thickness, e.g., a thickness of the center part and the edge part of the second plate 423 may be provided differently. The second plate 423 may have flat bottom surface and curved(convex) top surface, thereby the thickness of the second plate 423 may gradually decrease from the center to the edge. The first plate 421 and the electrode plate 422 may have an even thickness while the first plate 421 may have curved top and bottom surfaces (convex top surface and concave bottom surface) and the electrode plate 422 may have curved (convex) top surface mating with the concave bottom surface of the first plate 421 and curved (concave) bottom surface mating with convex top surface of the second plate 423. Accordingly, in the top electrode member 420, the thickness of the center $t_b$ may be different from the thickness of the edge $t_a$, e.g., the thickness of the center $t_b$ is greater than the thickness of the edge $t_a$.

According to an embodiment, a first thickness of the center of the top electrode member 420 and a second thickness of the edge part of the top electrode member 420 may be provided differently, and a difference between the first thickness and the second thickness may be 500% or less of the second thickness or 500% or less of the first thickness.

Through this, a heat transfer may be uniformly performed without significantly changing a structure.

That is, according to the inventive concept of FIG. 3 to FIG. 6, the thickness of the center part and edge part of the top electrode member 420 are provided differently, thereby enabling a more uniform heat transfer to an entire substrate compared to the embodiment of FIG. 2. More specifically, in the embodiments of FIG. 3 to FIG. 6, the thickness of the center part and the edge part are different from each other, thereby uniformly transferring a heat to the entire substrate by making a thermal conductivity different at the center part and the edge part. In addition, by making the thickness of the center part and the edge part different, a dielectric constant may be different at the center part and the edge part, so that the plasma can be uniformly excited throughout the entire substrate.

According to the inventive concept, it may be possible to completely transfer the microwave to the substrate without a loss of heat by using the embodiment of FIG. 2. According to an embodiment, in the case of the embodiment of FIG. 2, when applying the microwave, an equal heat transfer may not be possible for each position, and thus a heat transfer efficiency may vary for each position of the substrate.

According to the inventive concept, there is an effect of ensuring a uniformity of the heat transfer and the plasma by making the thicknesses of the center part and the edge part different from each other through the embodiment of FIG. 3 to FIG. 6. Accordingly, a uniform transfer to a bottom part of the top electrode member 420 may be induced, thereby enabling a uniform heat transfer, and thus increasing a productivity of the semiconductor chip.

A structure of the top electrode member 420 according to the inventive concept is not limited to the embodiments of FIG. 2 to FIG. 6. In FIG. 2 to FIG. 6, embodiments of setting only the thickness as a variable are illustrated, but a position and a material of the electrode plate 422 in addition to the thickness may be set differently. In addition, in FIG. 2 to FIG. 6, an embodiment where the center part is thicker than the edge part is illustrated, but the edge part may be provided thicker than the center part depending on a heat transfer situation.

The effects of the inventive concept are not limited to the above-mentioned effects, and the unmentioned effects can be clearly understood by those skilled in the art to which the inventive concept pertains from the specification and the accompanying drawings.

Although the embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a chamber having a treating space therein;
   a support unit disposed within the treating space and configured to support a substrate; and
   a plasma generation unit configured to generate a plasma from a process gas supplied to the treating space,
   wherein the plasma generation unit comprises:
   a bottom electrode member; and
   a top electrode member having a convex top surface and opposite to the bottom electrode member,
   wherein the top electrode member comprises:

an electrode plate including an electrode;
a first plate made of a different material from the electrode plate; and
a second plate,
wherein the second plate, the electrode plate, and the first plate are stacked on one another,
wherein the second plate is adjacent to the treating space of the chamber,
wherein the electrode plate is disposed in a space between a top surface of the second plate and a bottom surface of the first plate,
wherein a thickness of a center part of the top electrode member relative to a flat bottom surface of the top electrode member and a second thickness of an edge part of the top electrode member relative to the flat bottom surface of the top electrode member are different from each other.

2. The substrate treating apparatus of claim 1, wherein a thickness of a center part of the electrode plate and a thickness of an edge part of the electrode plate are different from each other.

3. The substrate treating apparatus of claim 1, wherein a thickness of a center part of the first plate and a thickness of an edge part of the first plate are different from each other.

4. The substrate treating apparatus of claim 1, wherein a thickness of a center part of the electrode plate and a thickness of an edge area of the electrode plate are different from each other, and
wherein a thickness of a center part of the first plate and a thickness of an edge area of the first plate are different from each other.

5. The substrate treating apparatus of claim 1, wherein a thickness of a center part of the second plate and a thickness of an edge area of the second plate are different from each other.

6. The substrate treating apparatus of claim 1, wherein the apparatus further comprises:
a heater located on the top electrode member and generating microwaves to heat a wafer supported by the support unit, and
wherein the electrode plate, the first plate, and the second plate are transparent to the microwaves.

7. The substrate treating apparatus of claim 6, wherein the first plate is formed of a quartz material, and
wherein the second plate is formed of one of a Y2O3, a YSZ (Yttria-stabilized zirconia, ZrO2/Y2O3), a YAG (yttrium aluminum garnet, Y3Al5O12), an Al2O3, a Cr2O3, a Nb2O5, a Si3N3, a mixture thereof and a stack combination thereof.

8. The substrate treating apparatus of claim 7, wherein the electrode plate is made of at least one of an Indium Tin Oxide (ITO), an Aluminum-doped Zinc Oxide (AZO), a Fluorine-doped Tin Oxide (FTO), an Antimony Tin Oxide (ATO), an SnO2, a ZnO, an IrO2, an RuO2, a graphene, a metal nanowire, a carbon nano tube (CNT), any mixture thereof and any stack combinations thereof.

9. A substrate treating apparatus comprising:
a chamber having a treating space therein;
a support unit disposed within the treating space and configured to support a substrate; and
a plasma generation unit configured to generate a plasma from a process gas supplied to the treating space,
wherein the plasma generation unit comprises:
a bottom electrode member; and a top electrode member opposite to the bottom electrode member,
wherein the top electrode member comprises:
an electrode plate having a convex top surface and including an electrode;
a first plate made of a different material from the electrode plate; and
a second plate,
wherein the second plate, the electrode plate, and the first plate are stacked on one another,
wherein the second plate is adjacent to the treating space of the chamber,
wherein the electrode plate is disposed in a space between a top surface of the second plate and a bottom surface of the first plate,
wherein a first thickness of a center part of the top electrode member relative to a flat bottom surface of the top electrode member and a second thickness of an edge part of the top electrode member relative to the flat bottom surface of the top electrode member are different, and
wherein a difference between the first thickness and the second thickness is 500% or less of the second thickness or 500% or less of the first thickness.

10. The substrate treating apparatus of claim 9, wherein a thickness of a center part of the electrode plate and a thickness of an edge part of the electrode plate are different from each other.

11. The substrate treating apparatus of claim 9, wherein a thickness of a center part of the first plate and a thickness of an edge part of the first plate are different from each other.

12. The substrate treating apparatus of claim 9, wherein a thickness of a center part of the electrode plate and a thickness of an edge area of the electrode plate are different from each other, and
wherein a thickness of a center part of the first plate and a thickness of an edge area of the first plate are different.

13. The substrate treating apparatus of claim 9, wherein a thickness of a center part of the second plate and a thickness of an edge area of the second plate are different from each other.

14. The substrate treating apparatus of claim 9, wherein the apparatus further comprises:
a heater located on the top electrode member and generating microwaves to heat a wafer supported by the support unit, and
wherein the electrode plate, the first plate, and the second plate are transparent to the microwaves.

15. The substrate treating apparatus of claim 14, wherein the first plate is formed of a quartz material, and
wherein the second plate is formed of one of a Y2O3, a YSZ (Yttria-stabilized zirconia, ZrO2/Y2O3), a YAG (yttrium aluminum garnet, Y3Al5O12), an Al2O3, a Cr2O3, a Nb2O5, a Si3N3, a mixture thereof and a stack combination thereof.

16. The substrate treating apparatus of claim 15, wherein the electrode plate is made of at least one of an Indium Tin Oxide (ITO), an Aluminum-doped Zinc Oxide (AZO), a Fluorine-doped Tin Oxide (FTO), an Antimony Tin Oxide (ATO), an SnO2, a ZnO, an IrO2, an RuO2, a graphene, a metal nanowire, a carbon nano tube (CNT), any mixture thereof and any stack combinations thereof.

* * * * *